US011658432B2

(12) United States Patent
Engelhardt, Jr.

(10) Patent No.: US 11,658,432 B2
(45) Date of Patent: May 23, 2023

(54) EDGE INTERCONNECTS FOR USE WITH CIRCUIT BOARDS AND INTEGRATED CIRCUITS

(71) Applicant: Indiana Integrated Circuits, LLC, South Bend, IN (US)

(72) Inventor: Robert Joseph Engelhardt, Jr., Broomfield, CO (US)

(73) Assignee: Indiana Integrated Circuits, LLC, South Bend, IN (US)

( * ) Notice: Subject to any disclaimer, the term of this patent is extended or adjusted under 35 U.S.C. 154(b) by 315 days.

(21) Appl. No.: 17/160,622

(22) Filed: Jan. 28, 2021

(65) Prior Publication Data

US 2021/0234294 A1 Jul. 29, 2021

Related U.S. Application Data

(60) Provisional application No. 62/966,777, filed on Jan. 28, 2020.

(51) Int. Cl.

| | | |
|---|---|---|
| *H01L 23/00* | (2006.01) | |
| *H01R 12/72* | (2011.01) | |
| *H01R 12/73* | (2011.01) | |
| *H05K 1/14* | (2006.01) | |
| *H05K 1/18* | (2006.01) | |
| *H05K 3/34* | (2006.01) | |
| *H01L 23/498* | (2006.01) | |

(52) U.S. Cl.
CPC ......... *H01R 12/727* (2013.01); *H01R 12/728* (2013.01); *H01R 12/732* (2013.01); *H05K 1/142* (2013.01); *H05K 1/181* (2013.01); *H01L 23/49838* (2013.01); *H05K 3/3436* (2013.01); *H05K 2201/10734* (2013.01)

(58) Field of Classification Search
CPC ............... H01L 21/486; H01L 21/6877; H01L 2224/03; H01L 23/49838
See application file for complete search history.

(56) References Cited

U.S. PATENT DOCUMENTS

| | | | |
|---|---|---|---|
| 7,608,919 B1 | 10/2009 | Bernstein et al. | |
| 7,612,443 B1 | 11/2009 | Bernstein et al. | |
| 8,905,794 B2 * | 12/2014 | Chawla | H01R 12/724 439/682 |

(Continued)

*Primary Examiner* — Phuong Chi Thi Nguyen
(74) *Attorney, Agent, or Firm* — The Webb Law Firm

(57) ABSTRACT

A substrate assembly includes a printed circuit (PC) substrate, first and second microchips, components or substrates mounted on a surface of the PC substrate, and a projection extending in spaced relation to the surface of the PC substrate. In one example, the projection extends between (i) a downward facing surface and/or an edge of a side facing surface proximate the downward facing surface of the first microchip, component or substrate and (ii) an upward facing surface and/or an edge of a side facing surface proximate the upward facing surface of the first microchip, component or substrate. The first and second microchips, components or substrates may be mounted on different levels of the PC substrate surface. In another example, the projection extends between a upward and/or side facing surface of a first microchip, component or substrate and a slot or cavity in a second microchip, component or substrate.

13 Claims, 5 Drawing Sheets

(56) References Cited

U.S. PATENT DOCUMENTS

| | | | |
|---|---|---|---|
| 9,017,092 B1* | 4/2015 | McCracken | H01R 13/648 439/39 |
| 9,039,425 B2* | 5/2015 | Mason | H05K 3/32 439/66 |
| 2018/0077801 A1 | 3/2018 | Kulick et al. | |
| 2022/0085532 A1* | 3/2022 | Costello | H01R 13/659 |

* cited by examiner

EDGE INTERCONNECTS FOR USE WITH CIRCUIT BOARDS AND INTEGRATED CIRCUITS

CROSS REFERENCE TO RELATED APPLICATION

This application claims priority from U.S. Provisional Application No. 62/966,777, filed Jan. 28, 2020, the contents of which are incorporated herein in its entirety by reference.

BACKGROUND OF THE INVENTION

Field of the Invention

The present invention relates to electrically interconnecting printed circuit substrates, such as, for example, one or more printed circuit (or wiring) boards, or one or more integrated circuit chips, or some combination of one or more printed circuit (or wiring) boards and one or more integrated circuit chips.

Description of Related Art

Heretofore, interconnecting printed circuit substrates, such as one or more printed circuit (or wiring) boards, or one or more integrated circuit chips, or some combination thereof, to form a substrate assembly was accomplished via one or more mechanical connectors or cables, e.g., ribbon cables, added to the printed circuit substrates and used as a mechanical and/or electrical interface between each pair of printed circuit substrates.

It would, however, be desirable to avoid using mechanical connectors or cables to connect pairs of printed circuit substrates, thereby reducing the physical size of the substrate assembly and/or one or both the printed circuit substrates, reducing the number of steps needed to manufacture the substrate assembly due to not having to mount or couple one or more mechanical connectors or cables to each printed circuit substrate, and, possibly, reducing the overall cost of manufacturing the substrate assembly and/or each printed circuit substrate.

SUMMARY OF THE INVENTION

Various preferred and non-limiting examples or aspects of the present invention will now be described and set forth in the following numbered clauses.

Clause 1: A substrate assembly comprises a printed circuit (PC) substrate; a first microchip, component or substrate mounted on a surface of the PC substrate; a second microchip, component or substrate mounted on the surface of the PC substrate; and a projection extending in spaced relation to the surface of the PC substrate between: (i) a downward facing surface of the first microchip, component or substrate and/or a side surface of the first microchip, component or substrate adjacent or proximate to said downward facing surface; and (ii) an upward facing surface of the second microchip, component or substrate and/or a side surface of the second microchip, component or substrate adjacent or proximate to said upward facing surface, wherein the projection comprises conductive material.

Clause 2: The substrate assembly of clause 1, wherein the projection may extend laterally or substantially laterally between the first microchip, component or substrate and the second microchip, component or substrate.

Clause 3: The substrate assembly of clause 1 or 2, wherein the projection may be formed partially or entirely of the conductive material.

Clause 4: The substrate assembly of any one of clauses 1-3, wherein the projection may include: a first part having a proximal end connected to the first microchip, component or substrate and a free, distal end; and a second part having a proximal end connected to the second microchip, component or substrate and a free, distal end, wherein the free, distal ends of the first and second parts are in electrical contact.

Clause 5: The substrate assembly of any one of clauses 1-4, wherein the first and second parts may be in electrical contact either directly or via an interposer.

Clause 6: The substrate assembly of any one of clauses 1-5, wherein: the surface of the PC substrate may include a vertical or substantially vertical step that defines on the surface of the PC substrate a first, higher elevation on a first side of the step and a second, lower elevation on a second side of the step; the first microchip, component or substrate may be mounted on the first side of the step; the second microchip, component or substrate may be mounted on the second side of the step; and the projection may extend in spaced relation to the surface of the PC substrate over the step.

Clause 7: The substrate assembly of any one of clauses 1-6, wherein: the projection may include a proximal end connected to one of the first and second microchip, component or substrate and a free, distal end; and the free, distal end of the projection may be received in a slot or cavity in the other of the first and second microchip, component or substrate.

Clause 8: The substrate assembly of any one of clauses 1-7, wherein the projection may include a proximal end connected to one of the first and second microchip, component or substrate and a free, distal end. The free, distal end of the projection may be received in a slot or cavity 76 in the other of the first and second microchip, component or substrate.

Clause 9: The substrate assembly of any one of clauses 1-8, wherein the substrate assembly may include a heat sink mounted on a side of the PC substrate opposite the surface 6 on which the first and second microchips, components or substrates are mounted.

Clause 10: The substrate assembly of any one of clauses 1-9, wherein the heat sink may include a part that extends through the PC substrate. At least one of the first and second microchips, components or substrates may be at least partially mounted on a surface of the part of the heat sink that extends through the PC substrate.

Clause 11: A substrate assembly comprises: a printed circuit (PC) substrate; a first microchip, component or substrate mounted on a surface of the PC substrate; a second microchip, component or substrate mounted on the surface of the PC substrate; and a projection extending in spaced relation to the surface of the PC substrate between: (i) a surface of the first microchip, component or substrate and/or a side or edge of the first microchip, component or substrate adjacent or proximate to the surface of the first microchip; and (ii) a surface of the second microchip, component or substrate and/or a side or edge of the second microchip, component or substrate adjacent or proximate to the surface of the second microchip, wherein: the projection comprises conductive material; the projection includes a proximal end connected to one of the first and second microchip, component or substrate and a free, distal end; and the free, distal end of the projection is received on the surface and/or the side edge of or in a slot or cavity in the other of the first and second microchip, component or substrate.

Clause 12: The substrate assembly of clause 11, wherein the projection may extend laterally or substantially laterally between the first microchip, component or substrate and the second microchip, component or substrate.

Clause 13: The substrate assembly of clause 11 or 12, wherein the projection may be formed partially or entirely of the conductive material.

BRIEF DESCRIPTION OF THE DRAWINGS

These and other features of the present invention will become more apparent from the following description in which reference is made to the appended drawings wherein.

DESCRIPTION OF THE INVENTION

Figure 1A:
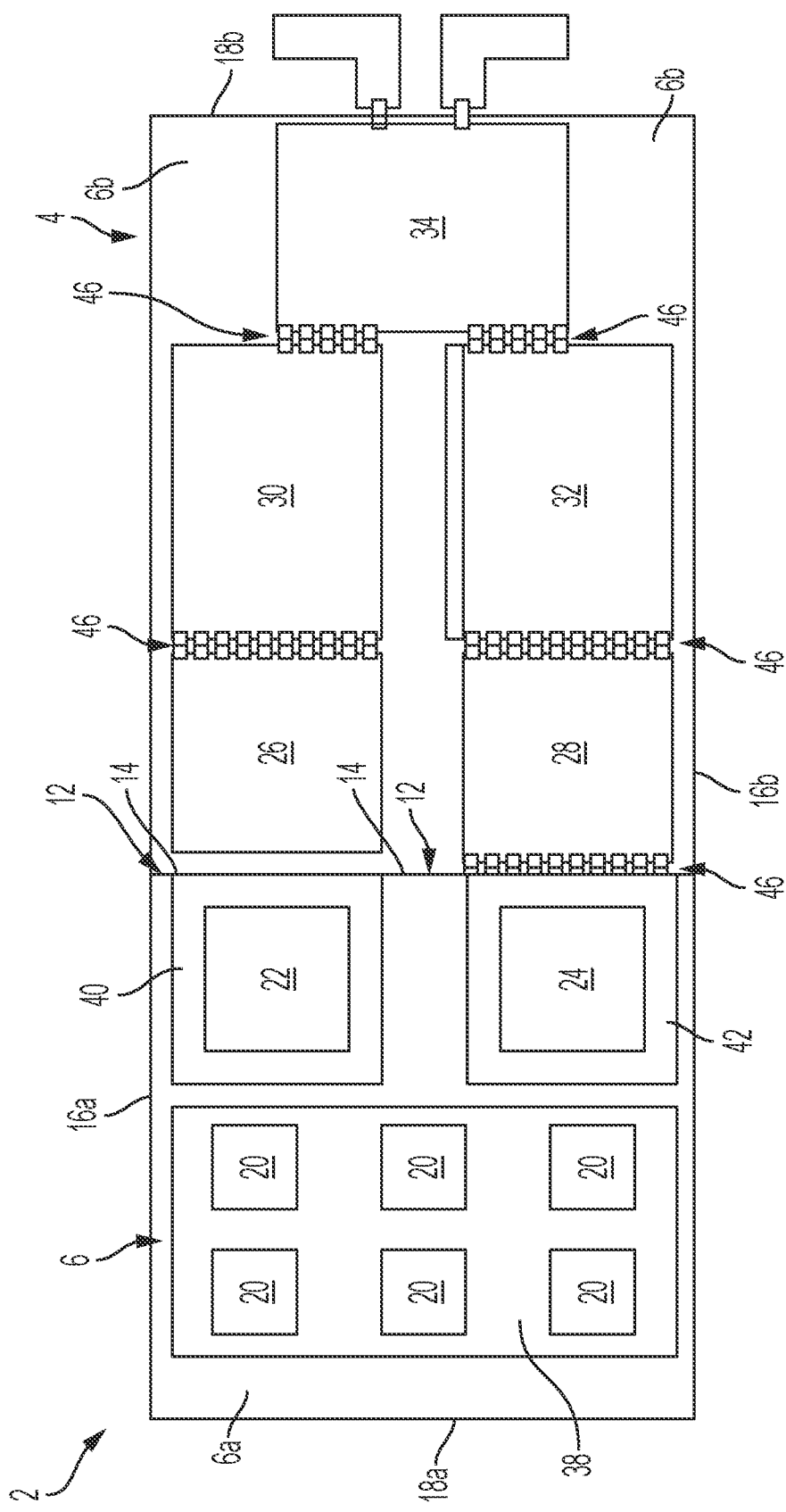
FIG. 1A is top assembled view of one non-limiting embodiment or example printed circuit (PC) assembly including a PC substrate including a top surface having a step between a first, higher elevation (on the left) and a second, lower elevation (on the right) and including a first set of one or more microchips, components, or substrates mounted on the top surface higher elevation and a second set of one or more microchips, components or substrates mounted on the top surface lower elevation, wherein at least one microchip, component, or substrate mounted on the top surface higher elevation and at least one microchip, component or substrate mounted on the top surface lower elevation are connected via one or more projections in the form of cantilevered beams including conductive material.

For the purposes of the following detailed description, it is to be understood that the invention may assume various alternative variations and step sequences, except where expressly specified to the contrary. It is also to be understood that the specific devices and methods described in the following specification are simply exemplary embodiments, examples, or aspects of the invention. Moreover, other than in any operating examples, or where otherwise indicated, all numbers expressing, in preferred and non-limiting embodiments, examples, or aspects, quantities of ingredients used in the specification and claims are to be understood as being modified in all instances by the term "about". Accordingly, unless indicated to the contrary, any numerical parameters set forth in the following specification and attached claims are approximations that may vary depending upon the desired properties to be obtained by the present invention. At the very least, and not as an attempt to limit the application of the Doctrine of Equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements.

Also, it should be understood that any numerical range recited herein is intended to include all sub-ranges subsumed therein. For example, a range of "1 to 10" is intended to include all sub-ranges between (and including) the recited minimum value of 1 and the recited maximum value of 10, that is, having a minimum value equal to or greater than 1 and a maximum value of equal to or less than 10.

It is also to be understood that the specific devices and processes illustrated in the attached drawings, and described in the following specification, are simply exemplary embodiments, examples, or aspects of the invention. Hence, specific dimensions and other physical characteristics related to the embodiments, examples, or aspects disclosed herein are not to be considered as limiting. Certain preferred and non-limiting embodiments, examples, or aspects of the present invention will be described with reference to the accompanying figures where like reference numbers correspond to like or functionally equivalent elements.

In this application, the use of the singular includes the plural and plural encompasses singular, unless specifically stated otherwise. In addition, in this application, the use of "or" means "and/or" unless specifically stated otherwise, even though "and/or" may be explicitly used in certain instances. Further, in this application, the use of "a" or "an" means "at least one" unless specifically stated otherwise.

In this application, the term "substantially . . . parallel", "substantially vertical", "substantially laterally" and the like may include angles that vary from parallel, vertical, and laterally by $\leq 5°$, $\leq 10°$, $\leq 20°$, or $\leq 30°$.

For purposes of the description hereinafter, the terms "end," "upper," "lower," "right," "left," "vertical," "horizontal," "top," "bottom," "lateral," "longitudinal," and derivatives thereof shall relate to the example(s) as oriented in the drawing figures. However, it is to be understood that the example(s) may assume various alternative variations and step sequences, except where expressly specified to the contrary. It is also to be understood that the specific example(s) illustrated in the attached drawings, and described in the following specification, are simply exemplary examples or aspects of the invention. Hence, the specific examples or aspects disclosed herein are not to be construed as limiting.

Figure 1B:
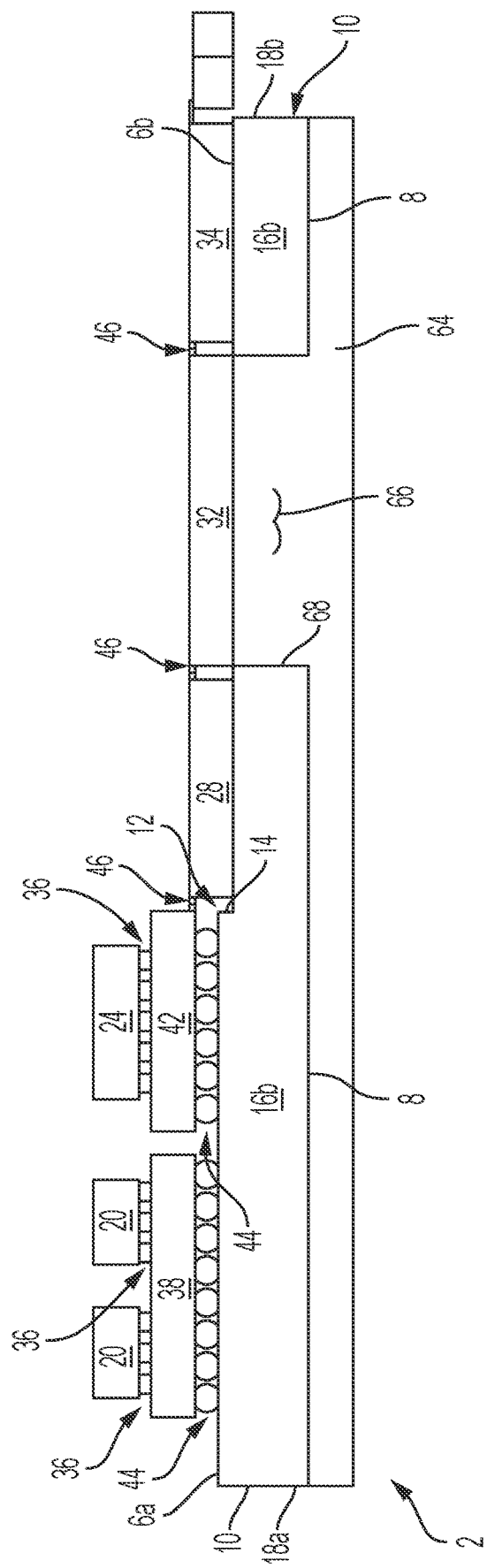
FIG. 1B is a side view of the PC substrate of FIG. 1A showing, among other things, the step between the first, higher elevation (on the left) and the second, lower elevation (on the right)

With reference to FIGS. 1A-1B, in some non-limiting embodiments or examples, a substrate assembly 2 in accordance with the principles of the present invention can include a printed circuit (PC) substrate 4 having a PC top surface 6 and a PC bottom surface 8 spaced from each other, e.g., in spaced parallel or substantially spaced parallel relation, and an edge 10 that runs or extends at least partially around the periphery of the PC substrate 4 between the PC top surface 6 and the PC bottom surface 8. In FIGS. 1A-1B, PC substrate 4 has a rectangular shape with sides 16a, 16b and ends 18a, 18a. However, the shape of PC substrate 4 is not limited to rectangular and PC substrate 4 may have any shape, e.g., square, round, etc., deemed suitable and/or desirable by one skilled in the art for a particular application.

In some non-limiting embodiments or examples, the top surface 6 can include a vertical or substantially vertical step 12 that defines a vertical or substantially vertical facet or face 14. In FIGS. 1A-1B, the vertical step 12 extends fully between the sides 16a, 16b of PC substrate 4. However, this is not to be construed in a limiting sense since it is envisioned that the vertical step may extend: fully between the ends 18a, 18b of PC substrate 4; or partially between the sides 16a, 16b and/or the ends 18a, 18b of PC substrate 4. For example, the vertical step may extend into the body of PC substrate 4 from one side 16 or end 18 and may terminate in the body of PC substrate 4 between the sides 16a, 16b or the ends 18a, 18b. In another example, the vertical step may extend only in the body of PC substrate 4 without extending to a side 16 or end 18 of the PC substrate 4. In an example, the vertical step 12 may be straight (as illustrated) or may have a jagged shape, or curved shape, or some combination of shapes.

In the non-limiting embodiment or example shown in FIGS. 1A-1B, the vertical step 12 separates the PC top surface 6 into a first, higher elevation 6a (on the left) and a second, lower elevation 6b (on the right). In an example, a first set of one or more microchips, components or substrates, e.g., microchips, components or substrates 20, 22, 24, can be mounted contact-side down in a manner known in the art, e.g., via ball grid arrays 36, to upward facing contacts of the PC top surface higher elevation 6a either directly (not shown) or, as shown, indirectly via upward facing contacts of one or more optional intermediate microchips, components, or substrates 38, 40, and/or 42 which may also include downward facing contacts which are mounted contact-side down in a manner known in the art, e.g., via ball grid arrays 44, to the upward facing contacts of the PC top surface higher elevation 6a.

In the non-limiting embodiment or example shown in FIGS. 1A-1B, a second set of one or more microchips, components or substrates, e.g., microchips, components or substrates 26, 28, 30, 32, and 34, can be mounted, in a manner known in the art, bottom-side or back-side down directly on the PC top surface lower elevation 6b with the contacts of microchips, components or substrates 26, 28, 30, 32, and 34 on the tops sides and/or along top edges proximate the tops sides thereof. In some non-limiting embodiments or examples, and as is known in the art, the backsides of microchips, components or substrates 26, 28, 30, 32, and 34 may be mounted and electrically coupled to upward facing contacts of PC top surface lower elevation 6b.

Each microchip, component or substrate and/or each intermediate microchip, component, or substrate (if provided) may include internal circuitry, e.g., transistors, components and/or conductors, as may be deemed suitable and/or desirable for an application. In a manner known in the art, the ball gird arrays 36 and, if provided, ball grid arrays 44 and one or more intermediate microchips, components, or substrates 38, 40, and/or 42, facilitate the passage of electrical power and/or electrical signals between PC substrate 4, which may also include internal conductors as is known in the art, and the microchips, components or substrates 20, 22, and/or 24 and/or (if provided) the intermediate microchips, components, or substrates 38, 40, and/or 42 mounted to the PC top surface higher elevation 6a.

In some non-limiting embodiments or examples, projections 46 in the form of cantilevered beams, spaced from the PC top surface 6 and including electrically conductive material, may be used to laterally electrically connect proximate or adjacent microchips, components or substrates and/or intermediate microchips, components, or substrates. In an example, a number of projections 46 in the form of cantilevered beams can be used to electrically connect circuitry on: intermediate microchip, component or substrate 42 and microchip, component or substrate 28; microchips, components or substrates 28 and 32; microchips, components or substrates 32 and 34; microchips, components or substrates 26 and 30; and/or microchips, components or substrates 30 and 34. Details regarding projections 46 in the form of cantilevered beams including (or formed of) electrically conductive material and methods of forming said projections 46 can be found in U.S. Pat. Nos. 7,608,919; 7,612,443; and US 2018/0077801 all of which are incorporated herein in their entireties by reference.

Figure 1C:
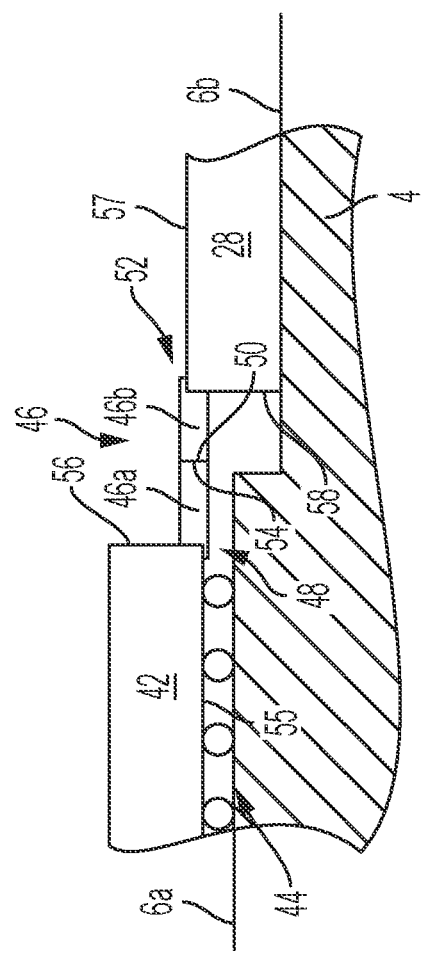
FIG. 1C is an isolated side view of the portion of FIG. 1B by the step between the first, higher elevation (on the left) and a second, lower elevation (on the right) including, in one non-limiting embodiment or example, the projection in the form of a two-part projection including one part extending from the bottom facing surface and/or side surface of the microchip, component, or substrate mounted on the first, higher elevation (on the left) and a second part extending from the upward facing surface and/or side surface of the microchip, component or substrate mounted on the second, lower elevation (on the right), wherein distal end of the first and second parts are in electrical contact, either directly or via an interposer.

With reference to FIG. 1C and with continuing reference to FIGS. 1A-1B, in some non-limiting embodiments or examples, each projection 46 may be formed in two parts including a first part 46a (including electrically conductive material) that is formed on and extends laterally from a microchip, component, or substrate and a second part 46b (including electrically conductive material) that is formed on and extends laterally from an adjacent or proximate microchip, component or substrate to contact the free end of first part 46a. In an example, microchip, component, or substrate 42 can include a first part 46a having a proximal 48 end supported by microchip, component, or substrate 42 and a free, distal end 50, and microchip, component or substrate 28 can include a second part 46b having a proximal 52 end supported by microchip, component or substrate 28 and a free, distal end 54 that electrically contacts the free, distal end 50 of first part 46a when microchip, component, or substrate 42 and microchip, component or substrate 28 are mounted to the respective PC top surface higher elevation 6a and PC top surface lower elevation 6b. In an example, projection 46 including first part 46a and second part 46b may be used to pass power and/or electrical signals between microchip, component, or substrate 42 and microchip, component or substrate 28.

In an example, first part 46a may extend laterally (or substantially laterally) from microchip, component, or substrate 42, in spaced parallel (or substantially parallel) relation to PC top surface higher elevation 6a, and second part 46b may extend laterally (or substantially laterally) from microchip, component or substrate 28 in parallel (or substantially parallel) relation to PC top surface lower elevation 6b. In an example, first part 46a may extend, in spaced parallel (or substantially parallel) relation to PC top surface higher elevation 6a, laterally (or substantially laterally) from a downward facing surface 55 of microchip, component, or substrate 42 and/or from an edge or side surface 56 of microchip, component, or substrate 42 adjacent or proximate to said downward facing surface 55. In an example, second part 46b may extend laterally (or substantially laterally) from an upward facing surface 57 of microchip, component or substrate 28 and/or from an edge or side surface 58 of microchip, component or substrate 28 adjacent or proximate to said upward facing surface 57.

As can be understood from FIGS. 1B and 1C, because microchip, component, or substrate 42 is mounted on PC top surface higher elevation 6a and because microchip, component or substrate 28 is mounted on PC top surface lower elevation 6b, the free, distal ends 50 and 54 of first and second parts 46a and 46b, extending laterally or substantially laterally from microchip, component, or substrate 42 and microchip, component or substrate 28, can make electrical contact, either directly or via an interposer, e.g., solder. Hence, as can be understood from the foregoing, via step 12 in PC top surface 6, microchips, components, or substrates mounted at different heights on PC substrate 4, e.g., mounted on PC top surface higher elevation 6a and on PC top surface lower elevation 6b, may be readily electrically connected via laterally (or substantially laterally) extending parts 46a and 46b of a projection 46.

The use of ball grid arrays 44 on the PC top surface higher elevation 6a may be optional. For example, the downward facing surface of microchip, component, or substrate 42 may be in direct contact with the PC top surface higher elevation 6a. In this example, part 46a may extend in contact with or in close proximity to the PC top surface higher elevation 6a. In another example, the downward facing surface of microchip, component, or substrate 42 may be supported in spaced relation to the PC top surface higher elevation 6a via any suitable and/or desirable standoff(s) in replacement of ball grid array 44. Combinations of standoff(s) and ball grid array 44 for supporting the downward facing surface of microchip, component, or substrate 42 in spaced relation to the PC top surface higher elevation 6a is also envisioned.

FIGS. 1A-1B also show, as noted above, laterally (or substantially laterally) extending projections 46 electrically connecting microchips, components or substrates 28 and 32; microchips, components or substrates 32 and 34; microchips, components or substrates 26 and 30; and/or microchips, components or substrates 30 and 34. In an example, each projections 46 may include first and second parts 46a and 46b as described above.

Figure 1D:
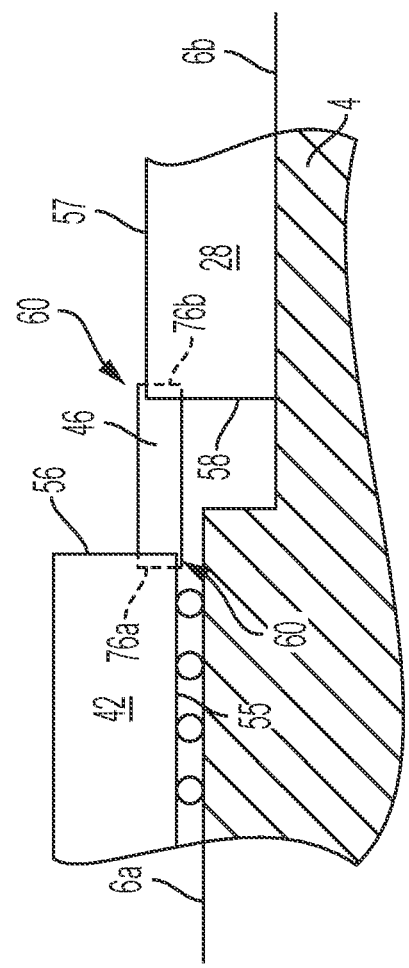
FIG. 1D is an isolated side view of the portion of FIG. 1B by the step between the first, higher elevation (on the left) and a second, lower elevation (on the right) including the projection in the form of a single, unitary (or single part) projection that extends between (i) the bottom facing surface and/or side surface of the microchip, component, or substrate mounted on the first, higher elevation (on the left) and (ii) the upward facing surface and/or side surface of the microchip, component or substrate mounted on the second, lower elevation (on the right), or vice versa.

With reference to FIG. 1D and with continuing reference to FIGS. 1A-1B, in some non-limiting embodiments or examples, projections 46 in the form of cantilevered beams may be a single (or one) part projection 46—versus the two part projections 46 described above having first and second parts 46a and 46b. In an example of a single part projection 46, when coupled between microchip, component or substrate 28 and microchip, component, or substrate 42, said single part projection 46 may have a first end 60 connected to the top surface 57 and/or the side surface 58 of microchip, component or substrate 28 and a second end 62 connected to the bottom facing surface 55 and/or the side surface 56 of microchip, component, or substrate 42.

In an example, single part projection 46 can be formed on and thereby made part of microchip, component or substrate 28 prior to mounting on PC top surface lower elevation 6b, whereupon first end 60 of single part projection 46 is a proximal end coupled to microchip, component or substrate 28 and second end 62 of single part projection 46 is a free, distal end that can be connected, either directly or via an interposer, e.g., solder, in electrical contact with a conductor on the downward facing surface 55 and/or the side surface 56 of microchip, component, or substrate 42 at a suitable time, e.g., at the time of mounting microchip, component, or substrate 42 to the PC top surface higher elevation 6a, e.g., via ball grid array 44.

In another example, single part projection 46 can be formed on and thereby made part of microchip, component, or substrate 42 prior to mounting on PC top surface higher elevation 6a, whereupon second end 62 of single part projection 46 is a proximal end coupled to microchip, component, or substrate 42 and first end 60 of single projection 46 is a free, distal end that can be connected, either directly or via an interposer, e.g., solder, in electrical contact with a conductor on the upward facing surface 57 and/or the side surface 58 of microchip, component or substrate 28 at a suitable time, e.g., at the time of mounting microchip, component or substrate 28 to the PC top surface lower elevation 6b.

In some non-limiting embodiments or examples, each projection 46 shown in FIGS. 1A-1B may be a single part projection 46 or may be a two part projection including parts 46a, 46b. Combinations of one or more single part projection 46 and one or more two part projections 46a, 46b as the projections 46 shown in FIGS. 1A-1B is/are also envisioned.

In some non-limiting embodiments or examples, an optional heat sink 64, formed of any suitable and/or desirable heat conductive material, may be joined or coupled to the PC bottom surface 8 as an aid in drawing away from one or more of the microchips, components, or substrates 20, 22, 24, 26, 28, 30, 32, 34, 38, 40, and/or 42 heat produced during operation thereof. In one non-limiting embodiment or example, heat sink 64 may include a part 66 that extends upward though an opening 68 in PC substrate 4, whereupon a backside of one or more microchips, components or substrates 26, 28, 30, 32, and/or 34 can be mounted and/or coupled to a top surface of at least a portion of said part 66. In the example of FIGS. 1A-1B, the backside of microchip, component or substrate 32 is mounted on to the top surface of part 66. However, this is not to be construed in a limiting sense. In one non-limiting embodiment or example, the top surface of part 66 may be at the same height as and co-planar with the PC top surface lower elevation 6b. However, this is not to be construed in a limiting sense since the top surface of part 66 and the PC top surface lower elevation 6b may be at different heights and not co-planar.

Some non-limiting embodiments or examples of the physical and electrical connection of the distal end of one or more single part projections 46 will now be described with reference to FIGS. 2A-2B and with continuing reference to FIGS. 1A, 1B, and 1D.

Figure 2A:
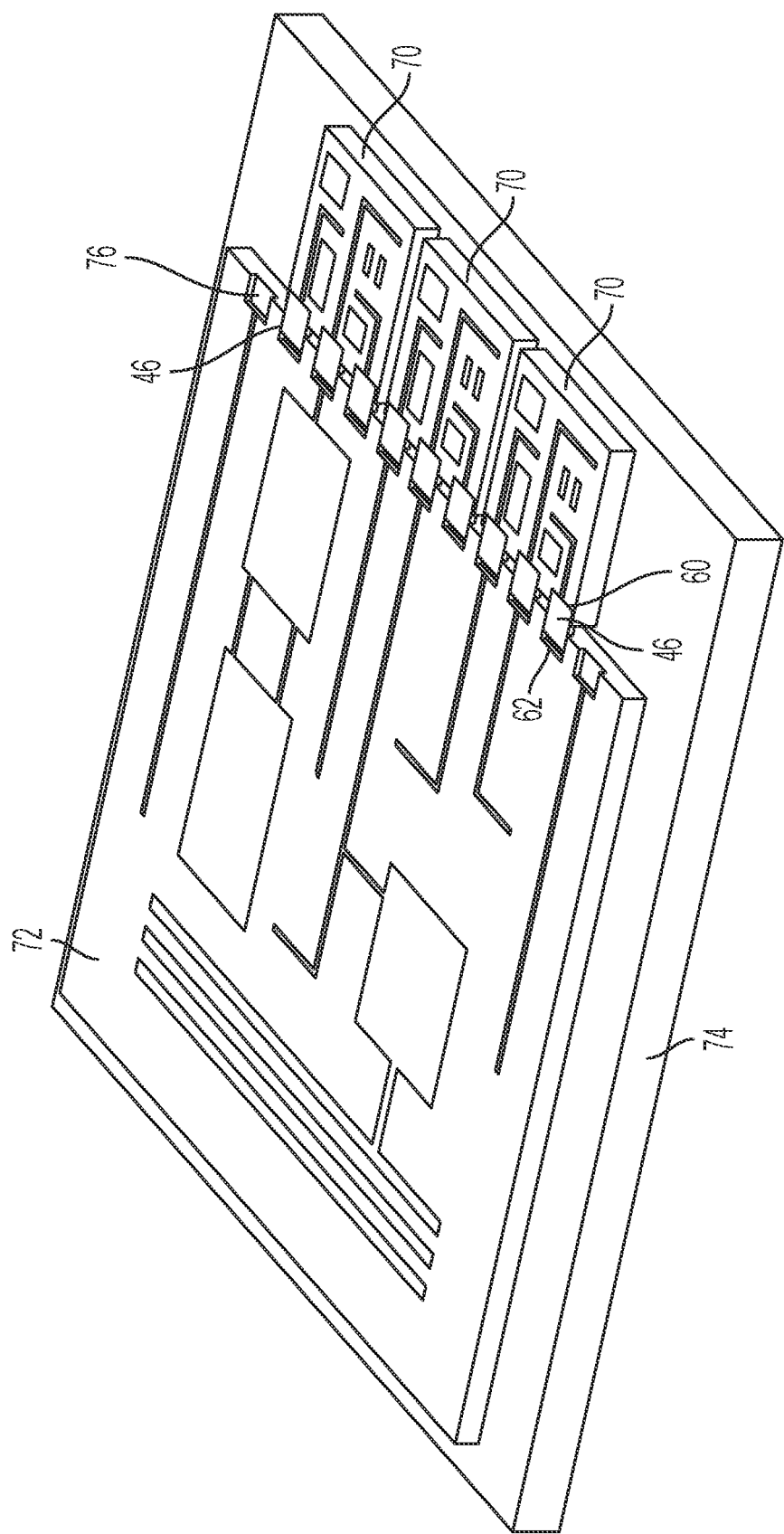
FIG. 2A is a perspective view of one non-limiting embodiment or example substrate assembly including a first set of (e.g., three) one or more microchips, components, or substrates coupled to a single microchip, component, or substrate via projections of conductive material formed as cantilevered beams, wherein each cantilever beam has a proximal end supported by and extending from one of the first set of microchips, components, or substrates and a free, distal end that rests in slot in a top surface of the single microchips, components, or substrate that opens along the edge thereof that faces first set of microchips, components, or substrates, and an optional substrate 74 supporting the backsides of microchips, components, or substrates 70 and 72.
Figure 2B:
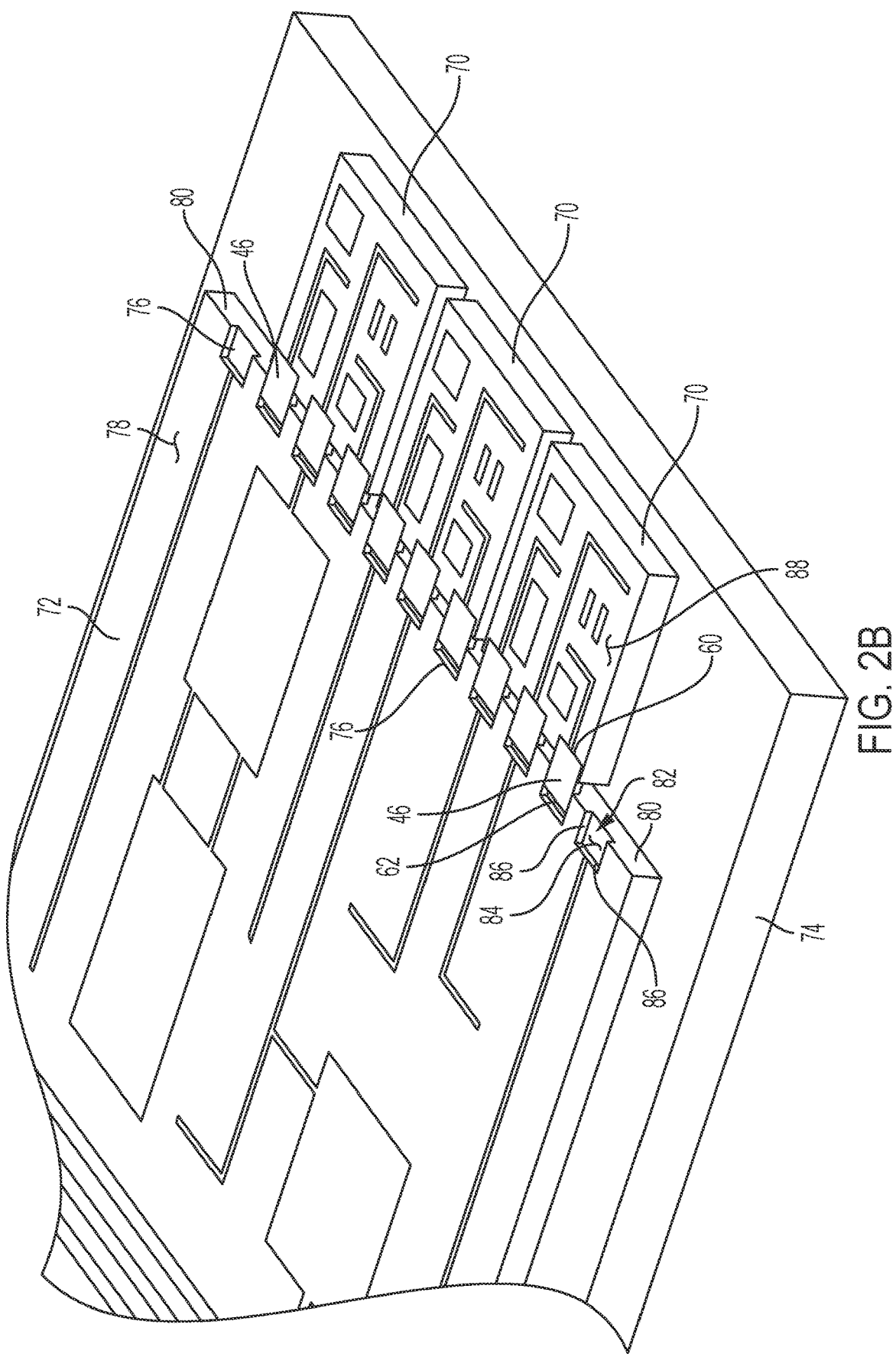
FIG. 2B is an enlarged isolated view of the right side of the example substrate assembly shown in FIG. 2A.

FIGS. 2A-2B show, in some non-limiting embodiments or examples, three microchips, components, or substrates 70 may be coupled via single part projections 46 to a microchip, component, or substrate 72. An optional substrate 74, e.g., like PC substrate 2, may be used to support or mount the backsides of microchips, components, or substrates 70 and 72. However, this is not to be construed in a limiting sense.

In a first non-limiting embodiment or example shown in FIGS. 2A-2B, each single part projection 46 is formed on and is part of a microchip, component, or substrate 70, whereupon a first end 60 of the single part projection 46 is a proximal end that is coupled to the microchip, component, or substrate 70 and the second end 62 of the single part projection 46 is the free, distal end. To facilitate the connection of the second (free, distal) end 62 of each single part projection 46 to microchip, component, or substrate 72, an upward facing surface 78 of microchip, component, or substrate 72 may be provided with a slot or cavity 76 having a base 84, sidewalls 86, and an opening 82 along an edge 80 of microchip, component, or substrate 72 facing microchip, component, or substrate 70. Each slot or cavity 76; microchips, components, or substrates 70 and 72; and each single part projection 46 may be configured such that the second (free, distal) end 62 of the single part projection 46 may be received in a slot or cavity 76 via the opening 82 along the edge 80 of a microchip, component, or substrate 72 when the microchips, components, or substrates 70 and 72 are operatively positioned proximate each other, for example, as shown in FIGS. 2A-2B.

In an example, each single part projection 46 may be comprised of conductive material that is electrically connected to circuitry of the corresponding microchip, component, or substrate 70. Each slot or cavity 76 receiving the second (free, distal) end 62 of a single part projection 46 may also be comprised of conductive material that is electrically connected to circuitry of microchip, component, or substrate 72. Thus, when the second (free, distal) end 62 of a single part projection 46 is received in the slot or cavity 76 (as described above), an electrical connection may be formed by the single part projection 46 between circuitry of the corresponding microchip, component, or substrate 70 and circuitry of the microchip, component, or substrate 72. The second (free, distal) end 62 of the single part projection 46 received in the slot or cavity 76 may, by contact alone, form the electrical connection between the single part projection 46 and the slot or cavity 76. However, an interposer, e.g., solder, may be used to facilitate electrical connection between the single part projection 46 and the slot or cavity 76.

In a second non-limiting embodiment or example, the arrangement of single part projections 46 and slots or cavities 76 of the first example may be reversed. For example, a number of single part projections 46 may be formed on and may extend laterally from the top surface and/or edge 80 of microchip, component, or substrate 72 and each microchip, component, or substrate 70 may include slots or cavities including openings 82, like slots or cavities 76, for receiving the distal, free ends of the single part projections 46 that extend laterally from top surface and/or edge 80 of microchip, component, or substrate 72.

In yet another example, combinations of one or more single part projections 46 extending from and slots or cavities 76 formed in microchips, components, or substrates 70 and 72 may be provided. In this example, a slot or cavity 76 and a single part projection 46 of microchip, component, or substrate 70 may be adjacent or proximate each other and may be connected to a mirror image arrangement of a single part projection 46 and a slot or cavity 76 of a microchip, component, or substrate 72.

In some non-limiting embodiments or examples, the use of one or more slots or cavities 76 including openings 82 receiving the free, distal end of one or more single part projections 46 described above in connection with FIGS. 2A-2B may also be used in connection with the non-limiting embodiment or example described above in connection with FIGS. 1A, 1B, and 1D. In an example, in FIG. 1D, the single part projection 46 may have a first, proximal end 60 connected to microchip, component or substrate 28 and may have a second (free, distal) end 62 received in a slot or cavity 76a (shown in phantom) of microchip, component or substrate 42. In another example, the single part projection 46 in FIG. 1D may have a first, proximal end 62 connected to microchip, component or substrate 42 and may have a second (free, distal) end 62 received in a slot or cavity 76b (shown in phantom) of microchip, component or substrate 28.

In some non-limiting embodiments or examples, the free, distal end of one or more single part projections 46 described above, instead of being received in a slot or cavity of a microchip, component or substrate 70 or 72, may be received on an upward surface and/or the side edge of said microchip, component or substrate 70 or 72, as shown, for example, in FIG. 1D, whereupon the corresponding slot or cavity may be omitted.

As can be seen, disclosed herein is a substrate assembly 2 comprising: a printed circuit (PC) substrate 4, a first microchip, component or substrate 42 mounted on a surface 6 of the PC substrate, a second microchip, component or substrate 28 mounted on the surface 6 of the PC substrate, and a projection 46 extending in spaced relation to the surface 6 of the PC substrate 4 between: (i) a downward facing surface 55 of the first microchip, component or substrate 42 and/or a side surface 56 of the first microchip, component or substrate 42 adjacent or proximate to said downward facing surface 55; and (ii) an upward facing surface 57 of the second microchip, component or substrate 28 and/or a side surface 58 of the second microchip, component or substrate 28 adjacent or proximate to said upward facing surface 57, wherein the projection 46 comprises conductive material.

The projection 46 may extend laterally or substantially laterally between the first microchip, component or substrate 42 and the second microchip, component or substrate 28.

The projection 46 may be formed partially or entirely of the conductive material.

The projection may include: a first part 46a having a proximal end 48 connected to the first microchip, component or substrate 42 and a free, distal end 50; and a second part 46b having a proximal end 52 connected to the second microchip, component or substrate and a free, distal end 54, wherein the free, distal ends 50, 54 of the first and second parts 46a and 46b may be in electrical contact.

The first and second parts 46a and 46b may be in electrical contact either directly or via an interposer.

The surface of the PC substrate 4 may include a vertical or substantially vertical step 12 that defines on the surface 6 of the PC substrate 4 a first, higher elevation 6a on a first side of the step and a second, lower elevation 6b on a second side of the step. The first microchip, component or substrate 42 may be mounted on the first side 6a of the step 12 and the second microchip, component or substrate 28 may be mounted on the second side 6b of the step 12. The projection 46 may extend in spaced relation to the surface of the PC substrate over the step 12.

The projection 46 may be a single part projection that includes a proximal end 60 connected to one of the first and second microchip, component or substrate and a free, distal end 62; and the free, distal end 62 of the projection 46 is received in a slot or cavity 76 in the other of the first and second microchip, component or substrate.

The substrate assembly may include a heat sink 64 mounted on a side of the PC substrate opposite the surface 6 on which the first and second microchips, components or substrates are mounted.

The heat sink 64 may include a part 66 that extends through the PC substrate 6. At least one of the first and second microchips, components or substrates may be at least partially mounted on a surface of the part 66 of the heat sink 64 that extends through the PC substrate 6.

Also disclosed is a substrate assembly comprising: a printed circuit (PC) substrate 74, a first microchip, component or substrate 70 mounted on a surface of the PC substrate 74, a second microchip, component or substrate 72 mounted on the surface of the PC substrate 74, and a projection 46 extending in spaced relation to the surface of the PC substrate 74 between: (i) a surface of the first microchip, component or substrate 70 and/or a side or edge of the first microchip, component or substrate 70 adjacent or proximate to the surface of the first microchip, component or substrate 70; and (ii) a surface of the second microchip, component or substrate 72 and/or a side or edge of the second microchip, component or substrate 72 adjacent or proximate to the surface of the second microchip, component or substrate 72, wherein: the projection 46 comprises conductive material, the projection 46 includes a proximal end 60 connected to one of the first and second microchips, components or substrates and a free, distal end 62, and the free, distal end 62 of the projection 46 is received on the surface and/or the side edge of or in a slot or cavity 76 in the other of the first and second microchips, components or substrates.

The projection 46 may extend laterally or substantially laterally between the first microchip, component or substrate and the second microchip, component or substrate.

The projection 46 may formed partially or entirely of the conductive material.

Herein, each instance of "conductive material" may include, without limitation, copper, aluminum, gold, or any other suitable and/or desirable conductive material, element, or compound.

Although the invention has been described in detail for the purpose of illustration based on what is currently considered to be the most practical non-limiting embodiments or examples, it is to be understood that such detail is solely for that purpose and that the invention is not limited to the disclosed non-limiting embodiments or examples, but, on the contrary, is intended to cover modifications and equivalent arrangements that are within the spirit and scope of the appended claims. For example, it is to be understood that the present invention contemplates that, to the extent possible, one or more features of any embodiment or example can be combined with one or more features of any other embodiment or example.

The invention claimed is:

1. A substrate assembly comprising:
a printed circuit (PC) substrate;
a first microchip, component or substrate mounted on a surface of the PC substrate;
a second microchip, component or substrate mounted on the surface of the PC substrate; and
a projection extending in spaced relation to the surface of the PC substrate between:
(i) a downward facing surface of the first microchip, component or substrate and/or a side surface of the first microchip, component or substrate adjacent or proximate to said downward facing surface; and
(ii) an upward facing surface of the second microchip, component or substrate and/or a side surface of the second microchip, component or substrate adjacent or proximate to said upward facing surface, wherein the projection comprises conductive material.

2. The substrate assembly of claim 1, wherein the projection extends laterally or substantially laterally between the first microchip, component or substrate and the second microchip, component or substrate.

3. The substrate assembly of claim 1, wherein the projection is formed partially or entirely of the conductive material.

4. The substrate assembly of claim 1, wherein:
the surface of the PC substrate includes a vertical or substantially vertical step that defines on the surface of the PC substrate a first, higher elevation on a first side of the step and a second, lower elevation on a second side of the step;
the first microchip, component or substrate is mounted on the first side of the step;
the second microchip, component or substrate is mounted on the second side of the step; and
the projection extends in spaced relation to the surface of the PC substrate over the step.

5. The substrate assembly of claim 1, wherein:
the projection includes a proximal end connected to one of the first and second microchip, component or substrate and a free, distal end; and
the free, distal end of the projection is received in a slot or cavity in the other of the first and second microchip, component or substrate.

6. The substrate assembly of claim 1, wherein the projection includes:
a first part having a proximal end connected to the first microchip, component or substrate and a free, distal end; and
a second part having a proximal end connected to the second microchip, component or substrate and a free, distal end,
wherein the free, distal ends of the first and second parts are in electrical contact.

7. The substrate assembly of claim 6, wherein the first and second parts are in electrical contact either directly or via an interposer.

8. The substrate assembly of claim 1, further including a heat sink mounted on a side of the PC substrate opposite the surface on which the first and second microchips, components or substrates are mounted.

9. The substrate assembly of claim 8, wherein the heat sink includes a part that extends through the PC substrate.

10. The substrate assembly of claim 9, wherein at least one of the first and second microchips, components or substrates are at least partially mounted on a surface of the part of the heat sink that extends through the PC substrate.

11. A substrate assembly comprising:
a printed circuit (PC) substrate;
a first microchip, component or substrate mounted on a surface of the PC substrate;
a second microchip, component or substrate mounted on the surface of the PC substrate; and
a projection extending in spaced relation to the surface of the PC substrate between:
(i) a surface of the first microchip, component or substrate and/or a side or edge of the first microchip, component or substrate adjacent or proximate to the surface of the first microchip; and
(ii) a surface of the second microchip, component or substrate and/or a side or edge of the second microchip, component or substrate adjacent or proximate to the surface of the second microchip, wherein:
the projection comprises conductive material;
the projection includes a proximal end connected to one of the first and second microchips, components or substrates and a free, distal end; and the free, distal end of the projection is received on the surface and/or the side edge of or in a slot or cavity in the other of the first and second microchips, components or substrates.

12. The substrate assembly of claim 11, wherein the projection extends laterally or substantially laterally between the first microchip, component or substrate and the second microchip, component or substrate.

13. The substrate assembly of claim 11, wherein the projection is formed partially or entirely of the conductive material.

\* \* \* \* \*